United States Patent
Chang et al.

(10) Patent No.: US 11,785,830 B2
(45) Date of Patent: Oct. 10, 2023

(54) METHOD OF MANUFACTURING ELECTROLUMINESCENT DEVICE HAVING LIGHT EMITTING LAYER BY USING TRANSFER PRINTING PROCESS

(71) Applicant: Hongyi Optical Co., Ltd., Taipei (TW)

(72) Inventors: Yao-Tang Chang, New Taipei (TW); Tzu Yu Lin, Taoyuan (TW)

(73) Assignee: Hongyi Optical Co., Ltd., Taipei (TW)

( * ) Notice: Subject to any disclaimer, the term of this patent is extended or adjusted under 35 U.S.C. 154(b) by 212 days.

(21) Appl. No.: 17/385,926

(22) Filed: Jul. 27, 2021

(65) Prior Publication Data

US 2022/0246852 A1    Aug. 4, 2022

Related U.S. Application Data

(60) Provisional application No. 63/143,034, filed on Jan. 29, 2021.

(30) Foreign Application Priority Data

May 7, 2021    (TW) ................................. 110116492

(51) Int. Cl.

| | |
|---|---|
| *H10K 71/18* | (2023.01) |
| *H10K 71/00* | (2023.01) |
| *H10K 50/15* | (2023.01) |
| *H10K 50/16* | (2023.01) |
| *H10K 50/115* | (2023.01) |

(52) U.S. Cl.
CPC .............. *H10K 71/18* (2023.02); *H10K 71/00* (2023.02); *H10K 50/115* (2023.02); *H10K 50/15* (2023.02); *H10K 50/16* (2023.02)

(58) Field of Classification Search
CPC ...... H10K 71/18; H10K 71/00; H10K 50/115; H10K 50/15; H10K 50/16; H01L 51/56; H01L 61/5056; H01L 51/5072; H01L 51/502; H01L 51/0013
See application file for complete search history.

(56) References Cited

U.S. PATENT DOCUMENTS

| | | | |
|---|---|---|---|
| 10,303,004 B2 * | 5/2019 | Xing ..................... | G02F 1/1333 |
| 2002/0047567 A1 | 4/2002 | Fujita et al. | |
| 2009/0108739 A1 * | 4/2009 | Shimizu ................. | H10K 71/13 |
| | | | 313/504 |

(Continued)

OTHER PUBLICATIONS

"Office Action of Taiwan Counterpart Application", dated Sep. 6, 2021, p. 1-p. 5.

*Primary Examiner* — Caleb E Henry
(74) *Attorney, Agent, or Firm* — JCIPRNET

(57) ABSTRACT

Provided is a method of manufacturing an electroluminescent device including: forming a first electrode layer on a substrate; forming a hole transport layer on the first electrode layer; forming a light emitting layer on the hole transport layer by using a transfer printing process; forming an electron transport layer on the light emitting layer; and forming a second electrode layer on the electron transport layer. Therefore, in the present disclosure, the manufacturing method of forming the light-emitting layer through the transfer printing process has the advantage of rapid manufacturing, and is suitable for manufacturing light emitting devices with a large area and any shape.

6 Claims, 3 Drawing Sheets

(56) References Cited

U.S. PATENT DOCUMENTS

| | | | |
|---|---|---|---|
| 2014/0087139 A1* | 3/2014 | Rowley | B41C 1/05 |
| | | | 427/256 |
| 2014/0216287 A1* | 8/2014 | Zwadlo | B82Y 10/00 |
| | | | 101/483 |
| 2018/0292715 A1* | 10/2018 | Xing | G02F 1/133382 |
| 2018/0331312 A1 | 11/2018 | Pan et al. | |
| 2020/0381677 A1* | 12/2020 | Gaynor | H10K 71/40 |

* cited by examiner

METHOD OF MANUFACTURING ELECTROLUMINESCENT DEVICE HAVING LIGHT EMITTING LAYER BY USING TRANSFER PRINTING PROCESS

CROSS-REFERENCE TO RELATED APPLICATIONS

This application claims the priority benefits of U.S. provisional application Ser. No. 63/143,034 filed on Jan. 29, 2021 and Taiwan application serial no. 110116492, filed on May 7, 2021. The entirety of each of the above-mentioned patent applications is hereby incorporated by reference herein and made a part of this specification.

BACKGROUND OF THE INVENTION

Field of the Invention

The present invention relates to a method for manufacturing an electroluminescent device.

Description of Related Art

Recently, with the advancement of semiconductor technology, various flat panel display devices have been developed to meet the needs of users. Compared with flat panel display devices such as liquid crystal display devices, quantum dot light emitting diode (QLED) display devices have considerable advantages in terms of viewing angle, contrast, thinness, light weight, and power consumption. In addition, the quantum dot light-emitting diode can be driven by a low direct current (DC) voltage, thus it also has a faster response time.

Currently, most of the quantum dot light emitting diode display devices on the market focus on photoluminescence devices. Specifically, the photoluminescence device refers to the use of a quantum dot enhancement film (QDEF) to improve the backlight source of a general light-emitting diode display screen. In other words, the blue light emitted from the blue LED backlight source can be converted into the red light and the green light after passing through the quantum dot enhancement film, thereby generating the blue light, the green light and the red light. However, the use of 450 nm blue light as a backlight source easily causes eye strains and is harmful to human eyes.

SUMMARY OF THE INVENTION

The present invention provides a method of manufacturing an electroluminescent device, which utilizes a transfer printing process to form a light emitting layer, so as to achieve rapid manufacturing and manufacture the electroluminescent device with a large area and any shape.

The present invention provides a method of manufacturing an electroluminescent device including: forming a first electrode layer on a substrate; forming a hole transport layer on the first electrode layer; forming a light emitting layer on the hole transport layer by using a first transfer printing process; forming an electron transport layer on the light emitting layer; and forming a second electrode layer on the electron transport layer.

In one embodiment of the present invention, the first transfer printing process includes a flexographic printing process.

In one embodiment of the present invention, the first transfer printing process includes using a transfer printing apparatus. The transfer printing apparatus includes: a doctor roller; an anilox roller, wherein the doctor roller is used to coat an ink onto the anilox roller uniformly; and a printing roller having a flexo plate, wherein the anilox roller is used to transfer an adsorbed ink to the flexo plate defined with a pattern, and the flexo plate is used to uniformly transfer the ink to the hole transport layer, thereby forming the light emitting layer.

In one embodiment of the present invention, the ink includes a quantum dot material, and the light emitting layer includes a quantum dot layer.

In one embodiment of the present invention, the method further includes using a second transfer printing process to form the hole transport layer on the first electrode layer.

In one embodiment of the present invention, the method further includes using a third transfer printing process to form the electron transport layer on the light emitting layer.

The present invention provides a method of manufacturing an electroluminescent device including: forming a light emitting layer between a hole transport layer and an electron transport layer by using a transfer printing process.

In one embodiment of the present invention, the first transfer printing process includes a flexographic printing process.

In one embodiment of the present invention, the light emitting layer includes a quantum dot layer.

In one embodiment of the present invention, the transfer printing process includes using a transfer printing apparatus. The transfer printing apparatus includes: a doctor roller; an anilox roller, wherein the doctor roller is used to coat the ink onto the anilox roller uniformly; and a printing roller having a flexo plate, wherein the anilox roller is used to transfer an adsorbed ink to the flexo plate defined with a pattern, and the flexo plate is used to uniformly transfer the ink to the hole transport layer, thereby forming the light emitting layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
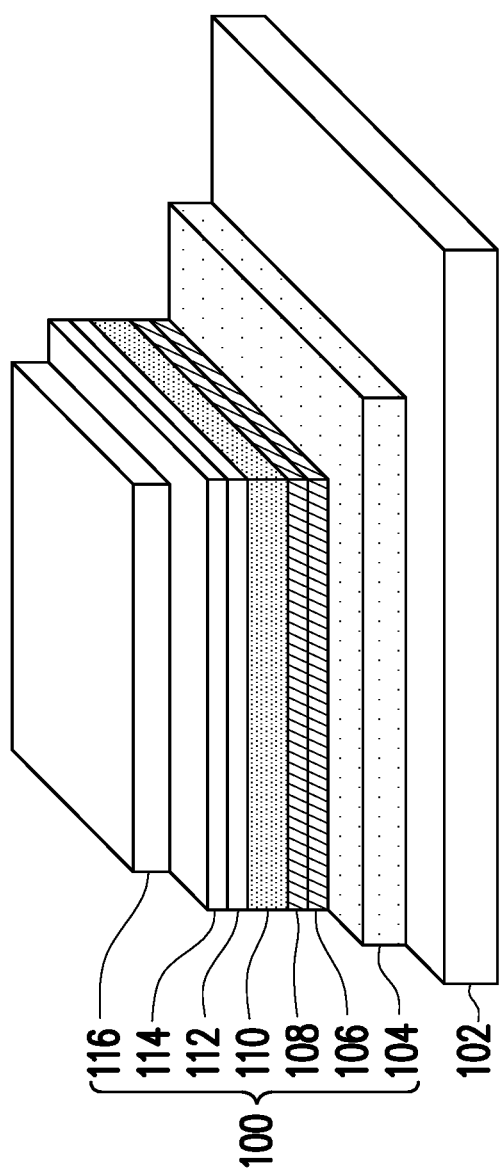
FIG. 1 is a schematic cross-sectional view of an electroluminescent device according to an embodiment of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures The spatially relative terms are intended to encompass different orientations of the device in use or operation in addition to the orientation depicted in the Figures The apparatus may be otherwise oriented (rotated 90 degrees or at other orientations) and the spatially relative descriptors used herein may likewise be interpreted accordingly.

FIG. 1 is a schematic cross-sectional view of an electroluminescent device according to an embodiment of the present invention.

Referring to FIG. 1, an embodiment of the present invention provides an electroluminescent device 100 disposed on a substrate 102. In one embodiment, a material of the substrate 102 may be glass, quartz, organic polymer, plastic, flexible plastic, opaque/reflective material (e.g., conductive material, metal, wafer, ceramic or other suitable materials), or other suitable materials, but the present invention is not limited thereto. If the conductive material or metal is used, an insulating layer (not shown) may cover on the substrate 102 to avoid the short issue. In some embodiments, the substrate 102 may also include an active device array (not shown), wherein the active device array includes a plurality of transistors (not shown), which are electrically connected to a corresponding first electrode layer 104 and second electrode layer 116, respectively. In the embodiment, the substrate 102 may be a glass substrate.

In an embodiment, the electroluminescent device 100 may be a quantum dot light emitting diode (QLED) device. Specifically, the electroluminescent device 100 may include a first electrode layer 104, a hole injection layer 106, a hole transport layer 108, a light emitting layer 110, an electron transport layer 112, an electron injection layer 114, and a second electrode layer 116 in order from bottom to top. In this case, the first electrode layer 104 may be used as an anode, and the second electrode layer 116 may be used as a cathode. The light emitting layer 110 may be a quantum dot light emitting layer having a plurality of quantum dots. In the quantum dot light emitting diode device 100, the holes from the first electrode layer 104 may be transmitted to the quantum dot light emitting layer 110 through the hole injection layer 106 and the hole transport layer 108, while the electrons from the second electrode layer 116 may be transmitted to the quantum dot light emitting layer 110 through the electron injection layer 114 and the electron transport layer 112. In this case, the transmitted electrons and holes are recombined in the quantum dot light emitting layer 110 to form excitons, thereby emitting light.

In alternative embodiments, the electroluminescent device 100 may sequentially include from bottom to top: a first electrode layer 104, an electron injection layer 106, an electron transport layer 108, a light emitting layer 110, a hole transport layer 112, a hole injection layer 114, and a second electrode layer 116. In this case, the first electrode layer 104 may be used as a cathode, and the second electrode layer 116 may be used as an anode.

In an embodiment, the materials of the first electrode layer 104 and the second electrode layer 116 may each include a conductive material, such as indium tin oxide (ITO), aluminum (Al), silver (Ag), chromium (Cr), copper (Cu)), nickel (Ni), titanium (Ti), molybdenum (Mo), magnesium (Mg), platinum (Pt), gold (Au) or a combination thereof. In the embodiment, the first electrode layer 104 and the second electrode layer 116 may include the same conductive material or different conductive materials. For example, the first electrode layer 104 may be an indium tin oxide (ITO) layer, and the second electrode layer 116 may be an aluminum layer.

In one embodiment, the material of the hole injection layer 106 may include an inorganic material and an organic material. The inorganic material may include, but is not limited to, suitable materials such as NiO, $WO_3$, $MoO_3$, etc. The organic material may include, but is not limited to, poly(3,4-ethylenedioxythiophene) polystyrene sulfonate (PEDOT:PSS) or other suitable materials. The material of the hole transport layer 108 may include an inorganic material and an organic material. The inorganic material may include, but is not limited to NiO; while the organic material may include, but is not limited to, TFB (Poly(9,9-dioctylfluorene-alt-N-(4-sec-butylphenyl)-diphenylamine)), pTPD (Poly(N,N'-bis-4-butylphenyl-N,N'-bisphenyl)benzidine) or other suitable materials. The material of the electron transport layer 112 may include, but is not limited to, suitable inorganic materials such as ZnO and ZnMgO. The material of the electron injection layer 114 may include, but is not limited to, suitable inorganic materials such as ZnO and LiF. In other embodiments, the electron transport layer 112 and the electron injection layer 114 may be combined into a single ZnO layer to achieve the functions of electron transport and electron injection simultaneously.

It should be noted that, in the present embodiment, the light emitting layer 110 includes a quantum dot layer. The quantum dot layer may include a plurality of quantum dots uniformly distributed in a matrix material. In addition, a plurality of quantum dots may also be selectively not added to the matrix material and used as a film alone. The quantum dots (QDs) are extremely tiny semiconductor nanostructures that are invisible to the naked eye. When the quantum dots are stimulated by external energy (such as light or electricity), which emit light with a wavelength in the visible light range and a pure color. The color of the light may be determined by the composition and particle size of the quantum dots. That is, a single type of quantum dots may emit a single color of light. When different quantum dot layers respectively include the quantum dots with different colors, which can be combined into different pixels, thereby achieving the function of full-color display. In addition, compared with the quantum dot photoluminescent device, the quantum dot electroluminescent device 100 of the present invention does not require a blue LED backlight, thus it can have the advantages of self-luminescence, wide viewing angle, high contrast, low power consumption, high response speed or the like, and have the effect of protecting eyes at the same time.

In some embodiments, the quantum dot includes a core, a core-shell, a core-alloy layer-shell, an alloy-shell, a core (alloy)-multilayer shell, or a combination thereof. The particle size or size of the quantum dots can be adjusted according to requirements (e.g., emitting visible light with different colors), and the present invention is not limited thereto. In some embodiments, the matrix material may include a resin material, such as acrylic resin, epoxy resin, silicone, or a combination thereof.

In an embodiment, the "core" may be, for example, at least one selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, and alloys thereof. In an embodiment, the "shell" is, for example, at least one selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe and alloys thereof. The core or the shell may be selected according to different requirements, and the present invention is not limited thereto.

Figure 2:
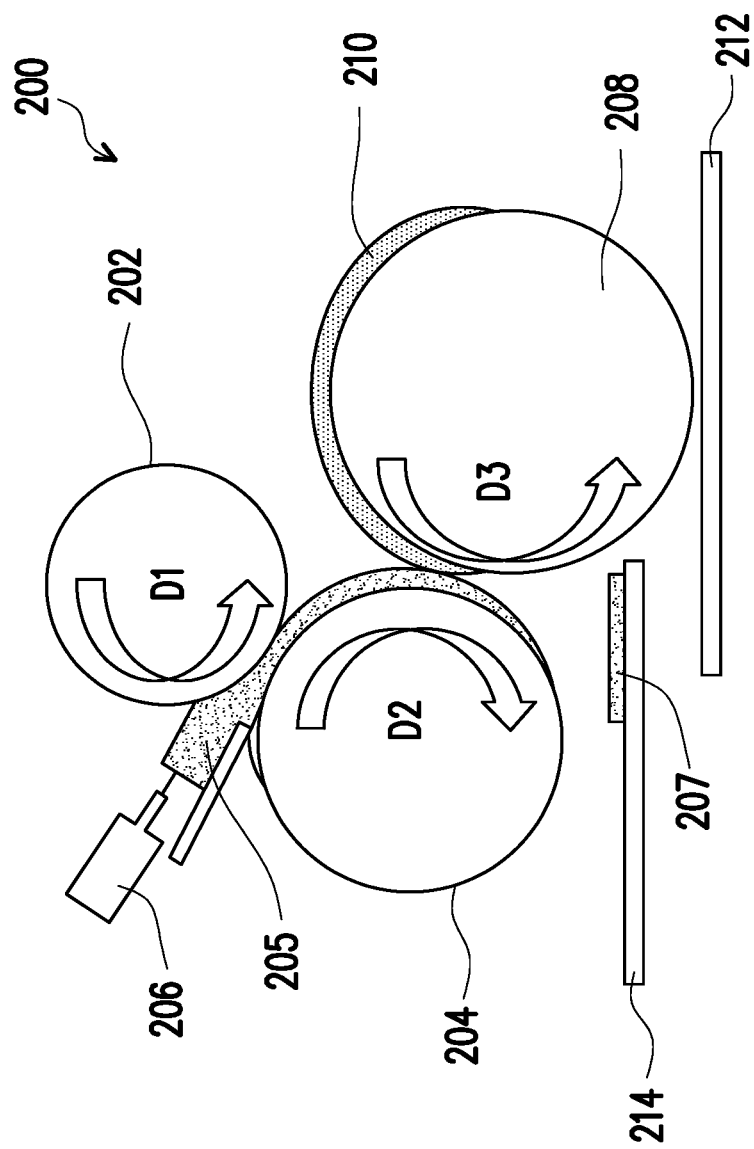
FIG. 2 is a schematic diagram of a transfer printing apparatus according to an embodiment of the present invention.
Figure 3:
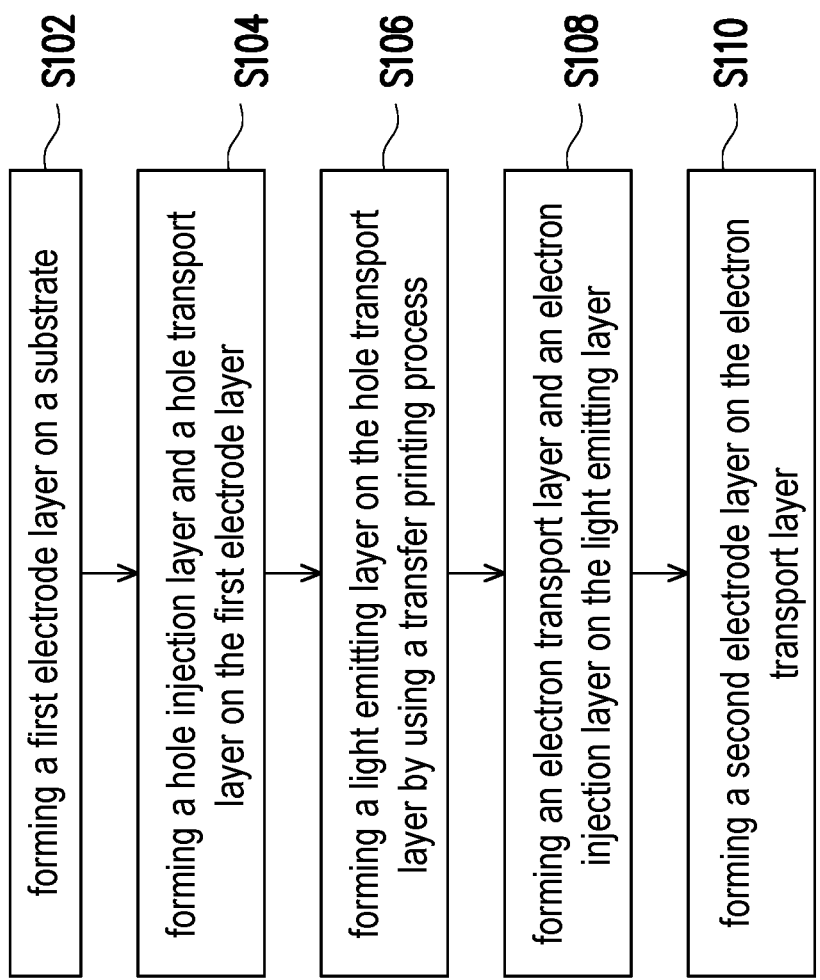
FIG. 3 is a block diagram of a method of manufacturing an electroluminescent device according to an embodiment of the present invention.

FIG. 2 is a schematic diagram of a transfer printing apparatus according to an embodiment of the present invention. FIG. 3 is a block diagram of a method of manufacturing an electroluminescent device according to an embodiment of the present invention.

Referring to FIG. 3, an embodiment of the present invention provides a method of manufacturing an electroluminescent device, which includes the following steps. First, a step S102 is performed, a first electrode layer is formed on the substrate. In one embodiment, the method of forming the first electrode layer includes: an evaporation process, a sputtering process, a spin coating process, an inkjet printing process, a transfer printing process, or a combination thereof. In the embodiment, the first electrode layer may be an anode, and may be formed on the glass substrate by the evaporation process. In alternative embodiments, when the first electrode layer is indium tin oxide (ITO), an etching process may be performed as required to fabricate the desired electrode pattern.

Next, a step S104 is performed, a hole injection layer and a hole transport layer are formed on the first electrode layer. In one embodiment, the method of forming the hole injection layer and the hole transport layer includes a spin coating process, an inkjet printing process, a transfer printing process, or a combination thereof. The configuration of the hole injection layer and the hole transport layer is illustrated in FIG. 1, and will not be repeated here.

Then, a step S106 is performed, a light emitting layer is formed on the hole transfer layer by using a transfer printing process. It should be noted that most of the current methods of forming the light emitting layer are based on the spin coating process and the inkjet printing process. However, the spin coating process will cause serious material loss, and it is easy to result in uneven material thickness in the use of manufacturing the light emitting device with large area. Therefore, the spin coating process is only suitable for the light emitting device with small-area. In addition, the inkjet printing process for manufacturing the light emitting device with large area has a slower manufacturing speed and is limited by the excessively long drying time of the ink, which is not conducive to manufacturing the light emitting device with large area (i.e., poor production efficiency). In contrast, in the present embodiment, the transfer printing process is used to form the light emitting layer, which can achieve rapid manufacturing and manufacture of the electroluminescent device with large area and any shape. Therefore, the method of manufacturing the electroluminescent device of the present embodiment is beneficial to mass production in industry, and is able to greatly reduce production cost, increase production capacity, thereby achieving commercial utilization.

In an embodiment, the transfer printing process may be a flexographic printing process, which may use the transfer printing apparatus 200 of FIG. 2 to form a light emitting layer on a substrate. In this embodiment, the light emitting layer includes a quantum dot layer. In detail, as shown in FIG. 2, the transfer printing apparatus 200 of the present embodiment includes: a doctor roller 202, an anilox roller 204, a nozzle 206, and a printing roller 208. During the transfer printing, the nozzle 206 sprays an ink 205 between the doctor roller 202 and the anilox roller 204. In an embodiment, the ink 205 includes a quantum dot material, which has a plurality of quantum dots uniformly distributed in the solvent. The solvent may include an organic solvent or an inorganic solvent. The organic solvent may include: alkane (carbon chain is 6-20) and its isomers, alcohol (carbon chain is 1-12) and its isomers, benzene, ketone (carbon chain is 3-12) and its isomers, or the like. The alkane may include, but is not limited to, n-hexane, n-heptane and the like. The alcohol may include, but is not limited to, methanol, ethanol, isopropanol, ethylene glycol, glycerol and the like. The benzene may include, but is not limited to, toluene, ethylbenzene, propylbenzene, butylbenzene, 6 methylbenzene, methyl ethylbenzene, and the like. The ketone may include, but is not limited to, acetone, butanone, and the like. The inorganic solvent may include silicone oil, mineral oil and similar solvents.

Then, the doctor roller 202 rotates along a first direction D1, and evenly coats the ink 205 on the anilox roller 204, wherein the anilox roller 204 rotates along a second direction D2. The surface of the anilox roller 204 may have a plurality of apertures or meshes to accommodate the ink 205. The doctor roller 202 may contact the anilox roller 204 to collect the ink 205 in the apertures or meshes. In an embodiment, the first direction D1 and the second direction D2 include different directions. For example, the first direction D1 is the counterclockwise direction, and the second direction D2 is the clockwise direction. Incidentally, the excess ink 207 that is not attached to the anilox roller 204 is received on the receiving tray 214, as shown in FIG. 2.

After that, the anilox roller 204 transfers the adsorbed ink 205 to the printing roller 208. Specifically, the printing roller 208 has a flexo plate 210 fixed on the surface of the printing roller 208. In one embodiment, the flexo plate 210 is made of soft materials such as rubber or resin, e.g., a photosensitive resin relief plate (manufactured by Japan's Asahi Kasei Co., Ltd., commonly referred to as APR plate in the industry). The flexo plate 210 has a plurality of convex patterns. The raised pattern corresponds to the region on the substrate 212 where the light emitting layer is to be formed. The anilox roller 204 may rotate along the second direction D2 and transfer the ink 205 to the flexo plate 210 with a defined pattern, wherein the printing roller 208 rotates along the third direction D3. In an embodiment, the second direction D2 and the third direction D3 include different directions. For example, the third direction D3 is the counterclockwise direction, and the second direction D2 is the clockwise direction. As shown in FIG. 2, the rotation of the anilox roller 204 and the printing roller 208 drives the flexo plate 210 to roll on the substrate 212 to be printed, so as to evenly transfer the ink 205 onto the hole transport layer of the substrate 212 to form the light emitting layer (or quantum dot layer). In some embodiments, the substrate 212 may be a flexible substrate. Since the flexo plate 210 has elasticity, the ink 205 can be uniformly pressed onto the flexible substrate 212 to form electroluminescent devices with various shapes. In this case, in the present embodiment, the use of the transfer printing process to form the light emitting layer with various shapes can better meet the various needs of the client, thereby enhancing commercial competitiveness.

Referring back to FIG. 3, a step S108 is performed, an electron transport layer and an electron injection layer are formed on the light emitting layer. In one embodiment, the method of forming the electron transport layer and the electron injection layer includes a spin coating process, an inkjet printing process, a transfer printing process, or a combination thereof. The configuration of the electron transport layer and the electron injection layer is shown in FIG. 1, and will not be repeated here.

Afterwards, step S110 is performed, a second electrode layer is formed on the electron transport layer. In an embodiment, the method of forming the second electrode includes: an evaporation process, a sputtering process, a spin coating process, an inkjet printing process, a transfer printing process, or a combination thereof. In the present embodiment, the second electrode layer may be a cathode, and is formed on the electron transport layer by the evaporation process.

Although the manufacturing method of FIG. 3 depicts a series of actions or steps, it should be understood that the method is not limited to the order shown. That is, in some embodiments, the steps may be performed in a different order than shown and/or may be performed simultaneously. Furthermore, in some embodiments, the steps shown may be subdivided into a plurality of steps that may be performed at separate times or concurrently with other steps or sub-steps. In some embodiments, some of the steps shown may be omitted, and other steps not shown may be included. For example, the steps of forming the hole injection layer and the hole transport layer may be interchanged with the steps of forming the electron injection layer and the electron transport layer. In other words, after the step S102 is performed, the electron injection layer and the electron transport layer may be formed on the first electrode layer. Next, the light emitting layer is formed on the electron transfer layer by the transfer printing process. Then, the hole transport layer and the hole injection layer are formed on the light emitting layer. Finally, the second electrode layer is formed on the hole transport layer. In the present embodiment, the first electrode layer may be used as a cathode, and the second electrode layer may be used as an anode.

In alternative embodiments, the said first electrode layer, hole injection layer, hole transport layer, electron transport layer, electron injection layer, and second electrode layer may all be formed by using the transfer printing apparatus 200 of FIG. 2. The detailed steps of the transfer printing process are as described above, and will not be repeated here. That is to say, in the present embodiment, the transfer printing apparatus 200 of FIG. 2 may be used to form the first electrode layer, the hole injection layer, the hole transport layer, the light emitting layer, the electron transport layer, the electron injection layer, and the second electrode layer to manufacture the electroluminescent device. In this case, the present embodiment is able to effectively reduce production costs, thereby enhancing commercial competitiveness.

In summary, the present invention uses the transfer printing process to form the light emitting layer between the hole transport layer and the electron transport layer, so as to achieve rapid manufacturing and may manufacture the electroluminescent device with large area and any shape. In this case, the method of manufacturing the electroluminescent device of the present invention is beneficial to mass production in industry, and is able to greatly reduce production costs and increase production capacity, thereby achieving commercial utilization and enhancing commercial competitiveness.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing an electroluminescent device, comprising:
    forming a first electrode layer on a substrate;
    forming a hole transport layer on the first electrode layer;
    forming a light emitting layer on the hole transport layer by using a first transfer printing process;
    forming an electron transport layer on the light emitting layer; and
    forming a second electrode layer on the electron transport layer,
    wherein the first transfer printing process comprises coating an ink onto an anilox roller uniformly, the ink comprises a quantum dot material, and the light emitting layer comprises a quantum dot layer,
    wherein the first transfer printing process comprises using a transfer printing apparatus, and the transfer printing apparatus comprises:
        a doctor roller, wherein the doctor roller is used to coat the ink onto the anilox roller uniformly; and
        a printing roller having a flexo plate, wherein the anilox roller is used to transfer an adsorbed ink to the flexo plate defined with a pattern, and the flexo plate is used to uniformly transfer the ink to the hole transport layer, thereby forming the light emitting layer.

2. The method of manufacturing the electroluminescent device of claim 1, wherein the first transfer printing process comprises a flexographic printing process.

3. The method of manufacturing the electroluminescent device of claim 1, further comprising using a second transfer printing process to form the hole transport layer on the first electrode layer.

4. The method of manufacturing the electroluminescent device of claim 1, further comprising using a third transfer printing process to form the electron transport layer on the light emitting layer.

5. A method of manufacturing an electroluminescent device, comprising:
    forming a light emitting layer between a hole transport layer and an electron transport layer by using a transfer printing process,
    wherein the transfer printing process comprises coating an ink onto an anilox roller uniformly, the ink comprises a quantum dot material, and the light emitting layer comprises a quantum dot layer,
    wherein transfer printing process comprises using a transfer printing apparatus, and the transfer printing apparatus comprises:
        a doctor roller, wherein the doctor roller is used to coat the ink onto the anilox roller uniformly; and
        a printing roller having a flexo plate, wherein the anilox roller is used to transfer an adsorbed ink to the flexo plate defined with a pattern, and the flexo plate is used to uniformly transfer the ink to the hole transport layer, thereby forming the light emitting layer.

6. The method of manufacturing the electroluminescent device of claim 5, wherein the first transfer printing process comprises a flexographic printing process.

* * * * *